(12) United States Patent
Wesslén et al.

(10) Patent No.: US 12,273,191 B2
(45) Date of Patent: *Apr. 8, 2025

(54) BIT ORDER OF NR PBCH PAYLOAD TO ENHANCE POLAR CODE PERFORMANCE

(71) Applicant: TELEFONAKTIEBOLAGET LM ERICSSON (PUBL), Stockholm (SE)

(72) Inventors: Anders Wesslén, Staffanstorp (SE); Dennis Hui, Sunnyvale, CA (US); Yufei Blankenship, Kildeer, IL (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/395,536

(22) Filed: Dec. 23, 2023

(65) Prior Publication Data

US 2024/0204912 A1 Jun. 20, 2024

Related U.S. Application Data

(63) Continuation of application No. 17/868,396, filed on Jul. 19, 2022, now Pat. No. 11,855,773, which is a
(Continued)

(51) Int. Cl.
*G06F 11/10* (2006.01)
*G06F 3/06* (2006.01)
(Continued)

(52) U.S. Cl.
CPC .......... *H04L 1/0042* (2013.01); *H03M 13/13* (2013.01); *H04L 1/0011* (2013.01);
(Continued)

(58) Field of Classification Search
CPC ... H04L 1/0071; H04L 1/0061; H04L 1/0011; H04L 1/0042; H03M 13/13
See application file for complete search history.

(56) References Cited

U.S. PATENT DOCUMENTS

| 5,517,522 A | 5/1996 | Arweiler et al. |
| 5,923,680 A | 7/1999 | Brueckheimer et al. |

(Continued)

FOREIGN PATENT DOCUMENTS

CA 2971769 A1 6/2016

OTHER PUBLICATIONS

Arikan, "Channel Polarization: A Method for Constructing Capacity-Achieving Codes for Symmetric Binary-Input Memoryless Channel", IEEE Transactions on Information Theory, vol. 55, No. 7, Jul. 2009.
(Continued)

*Primary Examiner* — Guy J Lamarre

(57) ABSTRACT

Systems and methods are described herein that allow information carrying bits of a transmission block to be placed at higher-reliability positions prior to transmission. An exemplary method includes generating a set of payload bits to be encoded for transmission, wherein the set of payload bits includes at least one known bit, interleaving the set of payload bits to generate an interleaved set of payload bits, wherein the interleaved set includes the at least one known bit in a predetermined position in the interleaved set, providing the interleaved set to a cyclic redundancy check (CRC) encoder to generate CRC-interleaved set of payload bits, wherein the CRC-interleaved set includes the at least one known bit in a predetermined position within the CRC-interleaved set, and encoding the CRC-interleaved set for transmission to a wireless device. Associated network nodes and wireless devices are included.

15 Claims, 13 Drawing Sheets

Related U.S. Application Data continuation of application No. 16/941,432, filed on Jul. 28, 2020, now Pat. No. 11,394,489, which is a continuation of application No. 16/293,396, filed on Mar. 5, 2019, now Pat. No. 10,727,976, which is a continuation of application No. PCT/IB2018/057707, filed on Oct. 3, 2018.

(60) Provisional application No. 62/567,738, filed on Oct. 3, 2017.

(51) Int. Cl.
   *H03M 13/09* (2006.01)
   *H03M 13/13* (2006.01)
   *H04L 1/00* (2006.01)

(52) U.S. Cl.
   CPC .......... *H04L 1/0058* (2013.01); *H04L 1/0061* (2013.01); *H04L 1/0071* (2013.01); *H03M 13/09* (2013.01)

(56) References Cited

U.S. PATENT DOCUMENTS

| | | | | |
|---|---|---|---|---|
| 10,727,976 | B2* | 7/2020 | Wesslen et al. | H03M 13/13 |
| 11,394,489 | B2* | 7/2022 | Wesslen et al. | H04L 1/0071 |
| 11,855,773 | B2* | 12/2023 | Wesslen et al. | H04L 1/0042 |
| 2005/0018705 | A1 | 1/2005 | Ohsuge | |
| 2008/0002854 | A1 | 1/2008 | Tehranchi et al. | |
| 2008/0184088 | A1 | 7/2008 | Yang et al. | |
| 2010/0005375 | A1 | 1/2010 | Dell et al. | |
| 2010/0210214 | A1 | 8/2010 | Pawar et al. | |
| 2010/0304779 | A1 | 12/2010 | Andrews et al. | |
| 2015/0270925 | A1 | 9/2015 | Lin et al. | |
| 2016/0079999 | A1 | 3/2016 | Shen et al. | |
| 2017/0288703 | A1 | 10/2017 | Shen et al. | |
| 2017/0353262 | A1 | 12/2017 | Zheng et al. | |
| 2017/0353269 | A1 | 12/2017 | Lin et al. | |
| 2019/0044656 | A1 | 2/2019 | Huang et al. | |
| 2019/0097756 | A1 | 3/2019 | Chatterjee et al. | |
| 2019/0104502 | A1 | 4/2019 | Wu et al. | |
| 2019/0319745 | A1 | 10/2019 | Pan et al. | |
| 2020/0028524 | A1 | 1/2020 | Huang et al. | |

OTHER PUBLICATIONS

Ericsson, "Polar Code Design for NR-PBCH", 3GPP TSG RAN WG1 Meeting NR#3, R1-1716757, Sep. 18-21, 2017.
Ericsson, R1-1717998 "Polar Code Design for NR-PBCH", 3GPP TSG RAN WG1 Meeting #90bis, R1-1717998, Oct. 9-13, 2017.
Intel Corporation, "Remaining Details of NR PBCH", 3GPP TSG RAN WG1 Meeting NR Ad-hoc #3, R1-1716277, Nagoya, Japan, Sep. 18-21, 2017.
Interdigital Inc., R1-1720645 "Ordering of PBCH Fields", 3GPP TSG RAN WG1 Meeting #91, R1-1720645, Nov. 27-Dec. 1, 2017.
Leroux, et al., "A Semi-Parallel Successive-Cancellation Decoder for Polar Codes," IEEE Transactions on Signal Processing, vol. 61, No. 2, Jan. 15, 2013.
Mediatek Inc., R1-1704462 "Polar Coding for NR-PBCH", 3GPP TSG RAN WG1 RAN1 Meeting NR#88-Bis, R1-1704462, Apr. 3-7, 2017.
NEC Corporation, "Polar code construction for NR control channel", 3GPP TSG-RAN WG1 NR Ad-hoc#2, R1-1710587, Jun. 27-30, 2017, Qingdao, P. R. China.
Samsung, "Early Termination of Polar Decoding", 3GPP TSG RAN WG1 #89, R1-1708047, May 15-19, 2017, Hangzhou, China.
Tal et al., "List Decoding of polar codes," in Proceedings of IEEE Symp. Inf. Theory, pp. 1-5, 2011.

* cited by examiner

| m | Π(m) | m | Π(m) | m | Π(m) | m | Π(m) | m | Π(m) | m | Π(m) | m | Π(m) | m | Π(m) |
|---|------|---|------|---|------|---|------|---|------|---|------|---|------|---|------|
| 0 | 0 | 28 | 50 | 56 | 119 | 84 | 173 | 112 | 45 | 140 | 152 | 168 | 90 | 196 | 197 |
| 1 | 2 | 29 | 54 | 57 | 121 | 85 | 175 | 113 | 48 | 141 | 154 | 169 | 93 | 197 | 203 |
| 2 | 3 | 30 | 55 | 58 | 122 | 86 | 178 | 114 | 51 | 142 | 156 | 170 | 96 | 198 | 73 |
| 3 | 5 | 31 | 57 | 59 | 125 | 87 | 179 | 115 | 56 | 143 | 159 | 171 | 104 | 199 | 78 |
| 4 | 6 | 32 | 59 | 60 | 126 | 88 | 180 | 116 | 58 | 144 | 162 | 172 | 107 | 200 | 98 |
| 5 | 8 | 33 | 60 | 61 | 127 | 89 | 182 | 117 | 61 | 145 | 165 | 173 | 124 | 201 | 204 |
| 6 | 11 | 34 | 62 | 62 | 129 | 90 | 183 | 118 | 63 | 146 | 167 | 174 | 134 | 202 | 99 |
| 7 | 12 | 35 | 64 | 63 | 130 | 91 | 186 | 119 | 65 | 147 | 169 | 175 | 139 | 203 | 205 |
| 8 | 13 | 36 | 67 | 64 | 131 | 92 | 187 | 120 | 68 | 148 | 172 | 176 | 145 | 204 | 100 |
| 9 | 16 | 37 | 69 | 65 | 132 | 93 | 189 | 121 | 70 | 149 | 174 | 177 | 157 | 205 | 206 |
| 10 | 19 | 38 | 74 | 66 | 136 | 94 | 192 | 122 | 75 | 150 | 176 | 178 | 160 | 206 | 101 |
| 11 | 20 | 39 | 79 | 67 | 137 | 95 | 194 | 123 | 81 | 151 | 181 | 179 | 163 | 207 | 207 |
| 12 | 22 | 40 | 80 | 68 | 141 | 96 | 198 | 124 | 87 | 152 | 184 | 180 | 177 | 208 | 208 |
| 13 | 24 | 41 | 84 | 69 | 142 | 97 | 199 | 125 | 89 | 153 | 188 | 181 | 185 | 209 | 209 |
| 14 | 28 | 42 | 85 | 70 | 143 | 98 | 200 | 126 | 92 | 154 | 190 | 182 | 191 | 210 | 210 |
| 15 | 32 | 43 | 86 | 71 | 147 | 99 | 1 | 127 | 95 | 155 | 193 | 183 | 196 | 211 | 211 |
| 16 | 33 | 44 | 88 | 72 | 148 | 100 | 4 | 128 | 103 | 156 | 195 | 184 | 202 | 212 | 212 |
| 17 | 35 | 45 | 91 | 73 | 149 | 101 | 7 | 129 | 106 | 157 | 201 | 185 | 27 | 213 | 213 |
| 18 | 37 | 46 | 94 | 74 | 151 | 102 | 9 | 130 | 112 | 158 | 10 | 186 | 31 | 214 | 214 |
| 19 | 38 | 47 | 102 | 75 | 153 | 103 | 14 | 131 | 115 | 159 | 15 | 187 | 53 | 215 | 215 |
| 20 | 39 | 48 | 105 | 76 | 155 | 104 | 17 | 132 | 117 | 160 | 18 | 188 | 72 | 216 | 216 |
| 21 | 40 | 49 | 109 | 77 | 158 | 105 | 21 | 133 | 120 | 161 | 26 | 189 | 77 | 217 | 217 |
| 22 | 41 | 50 | 110 | 78 | 161 | 106 | 23 | 134 | 123 | 162 | 30 | 190 | 83 | 218 | 218 |
| 23 | 42 | 51 | 111 | 79 | 164 | 107 | 25 | 135 | 128 | 163 | 52 | 191 | 97 | 219 | 219 |
| 24 | 44 | 52 | 113 | 80 | 166 | 108 | 29 | 136 | 133 | 164 | 66 | 192 | 108 | 220 | 220 |
| 25 | 46 | 53 | 114 | 81 | 168 | 109 | 34 | 137 | 138 | 165 | 71 | 193 | 135 | 221 | 221 |
| 26 | 47 | 54 | 116 | 82 | 170 | 110 | 36 | 138 | 144 | 166 | 76 | 194 | 140 | 222 | 222 |
| 27 | 49 | 55 | 118 | 83 | 171 | 111 | 43 | 139 | 150 | 167 | 82 | 195 | 146 | 223 | 223 |

FIG. 3

BIT ORDER OF NR PBCH PAYLOAD TO ENHANCE POLAR CODE PERFORMANCE

PRIORITY INFORMATION

This application is a continuation application of U.S. patent application Ser. No. 17/868,396, filed Jul. 19, 2022, granted as U.S. Pat. No. 11,855,773 on Dec. 26, 2023, which is a continuation application of U.S. patent application Ser. No. 16/941,432, filed Jul. 28, 2020, granted as U.S. Pat. No. 11,394,489 on Jul. 19, 2022, which is a continuation application of U.S. patent application Ser. No. 16/293,396, filed Mar. 5, 2019, granted as U.S. Pat. No. 10,727,976 on Jul. 28, 2020, which is a continuation application of International Patent Application No. PCT/IB2018/057707, filed Oct. 3, 2018, which claims priority to and the benefit of U.S. Provisional Patent Application No. 62/567,738, filed Oct. 3, 2017, entitled "Bit Order of NR PBCH Payload to Enhance Polar Code Performance," the disclosures of which are hereby incorporated herein by reference in their entireties.

TECHNICAL FIELD

Certain embodiments of the present disclosure relate, in general, to polar code performance and more specifically to a bit order of New Radio Physical Broadcast Channel (NR PBCH) payload to enhance polar code performance.

BACKGROUND

Polar Coding

Polar codes, proposed by Arikan (in E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009) are the first class of constructive coding schemes that are provable to achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. Later, SC list (SCL) decoder is proposed by Tal and Vardy (in I. Tal and A. Vardy, "List Decoding of polar codes," in Proceedings of IEEE Symp. Inf. Theory, pp. 1-5, 2011), which can approach the performance of optimal maximum-likelihood (ML) decoder. By concatenating a simple CRC coding, it was shown that the performance of concatenated polar code is competitive with that of well-optimized LDPC and Turbo codes. As a result, polar codes are being considered as a candidate for future 5G wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e. error free) while the rest of them are nearly useless (i.e. totally noisy). The point is to use the nearly perfect channel to transmit data to the receiver while setting the input to the useless channels to have fixed or frozen values (e.g. 0) known to the receiver. For this reason, those input bits to the nearly useless and the nearly perfect channel are commonly referred to as frozen bits and non-frozen (or information) bits, respectively. Only the non-frozen bits are used to carry data in a polar code. Loading the data into the proper information bit locations have directly impact on the performance of a polar code. An illustration of the structure of a length-8 polar code is illustrated in FIG. 1 (example of polar code structure with N=8).

FIG. 2 illustrates an example of polar encoding with N=8. FIG. 2 shows the labeling of the intermediate info bits $s_{l,i}$, where $l \in \{0,1, \ldots, n\}$ and $i \in \{0,1, \ldots, N-1\}$ during polar encoding with N=8. The intermediate info bits are related by the following equation:

$$s_{l+1,i} = s_{l,i} \oplus s_{l,i+2^l},$$

for $$i \in \left\{ j \in \{0, 1, \ldots, N-1\}: \mathrm{mod}\left(\left\lfloor \frac{j}{2^l} \right\rfloor, 2\right) = 0 \right\}$$

and $$l \in \{0, 1, \ldots, n-1\}$$

$$s_{l+1,i+2^l} = s_{l,i+2^l},$$

for $$i \in \left\{ j \in \{0, 1, \ldots, N-1\}: \mathrm{mod}\left(\left\lfloor \frac{j}{2^l} \right\rfloor, 2\right) = 0 \right\}$$

and $$l \in \{0, 1, \ldots, n-1\}$$

with $s_{0,i} \equiv u_i$ be the info bits, and $s_{n,i} \equiv x_i$ be the code bits, for $i \in \{0,1, \ldots, N-1\}$.

For Polar code with distributed CRC, the input to the Polar encoder is first interleaved associated with the CRC polynomial. The information bits are interleaved, and a subset of CRC bits are distributed among the information bits.

The bit sequence $c_0, c_1, c_2, c_3, \ldots, c_{K-1}$ is interleaved into bit sequence $c'_0, c'_1, c'_2, c'_3, \ldots, c'_{K-1}$ as follows:

$$c'_k = c_{\Pi(k)},$$
$$k = 0, 1, \ldots, K-1$$

where the interleaving pattern $\Pi(k)$ is given by the following:

```
if I_IL = 0
    Π(k) = k , k = 0,1,..., K − 1
else
    k = 0 ;
    for m = 0 to K_IL^max − 1
        if Π_IL^max (m) ≥ K_IL^max − K
            Π(k) = Π_IL^max (m) − (K_IL^max − K);
            k = k + 1 ;
        end if
    end for
end if
``` where $\Pi_{IL}^{max}(m)$ is given by TS 38.212, Table 5.3.1-1 (Interleaving pattern $\Pi_{IL}^{max}(m)$), an example of which is shown in FIG. 3.

New Radio Physical Broadcast Channel
(NR-PBCH)

The 5G New Radio (NR) communication systems can operate with carrier frequencies ranging from hundreds of MHz to hundreds of GHz. When operating in very high frequency band, such as the millimeter-wave (mmW) bands (~30-300 GHz), radio signals attenuate much more quickly with distance than those in lower frequency band (e.g. 1-3 GHz). Hence, in order to broadcast system information to user equipment (UE) over the same intended coverage area, beamforming is typically used to achieve power gain to compensate the path loss in high frequencies. Since the signal coverage of each beam can be quite narrow when many antennas are used to form the beam, the system information needs to be broadcast or transmitted at a different beam direction one at a time. This process of transmitting signal carrying the same information using beams with different (azimuth and/or elevation) directions one at a time is commonly referred to as beam sweeping. Since typically only one of the many beams carrying the same system information can reach a particular receiver with good signal strength, the receiver does not know the location of the received beam in the overall radio frame structure. In order to allow the receiver to determine the start and the end of a periodic radio frame, a time index is often included when broadcasting the system information through beam sweeping.

For example, FIG. 4 shows an example of how system information can be broadcast together with reference synchronization signal (SS) through beam sweeping. In this figure, the system information is carried by a physical channel called NR-PBCH which is transmitted in multiple synchronization blocks (SSB), each beamformed in a different direction. The SSBs are repeated within a certain NR-PBCH transmission time period (TTI, 80 ms in this example). Within a NR-PBCH TTI, the system information carried by NR-PBCH, MIB, in each SSB is the same. However, each NR-PBCH also carries a time index in order for the receiver to determine the radio frame boundaries. NR-PBCH may be encoded using Polar codes.

A preferred construction of the content of PBCH is shown below.

SUMMARY

Certain problems may be envisioned with transmitting a broadcast channel according to existing solutions. For example, NR-PBCH, or any broadcast channel, often carries some subset of bits that are either known or partially known, in the sense that there is a known relationship of these bits with other bits in adjacent blocks. Examples of these known or partially-known bits, are reserved bits (which are often set to known value such as 0 when they are not used) or (SS Block) Time Index (which is known to have a fix increment from the corresponding Time Index in the previous block of transmitted bits). In existing solutions, these known or partially known bits are placed in arbitrary positions, which does not enable the decoder to effectively exploit these known bit values during the decoding process. Certain embodiments of the present disclosure may provide a solution to these and other problems.

According to certain embodiments, a method comprises identifying the payload bits of NR PBCH that have known values (typically all zero or some hypothesized values based on their relationship with adjacent blocks). The method then comprises placing those bits appropriately to enhance Polar code performance, where the Polar code is the channel coding technique adopted for NR PBCH. The enhanced performance can be represented in terms of reduced block error rate or reduced processing time needed to detect a decoded block with errors in order to achieve early termination benefits, such as reduced latency and reduced energy consumption.

According to certain embodiments, in addition to exploiting bits that are known or partially known a priori, certain special bits, commonly called Parity Check (PC) bits, are intentionally placed at certain known locations to enhance Pole code performance. These PC bits are often data dependent (unlike the a priori known or partially known bits). The decoder can exploit the known relationship of these PC bits with other data bits to enhance the Polar code performance. The present disclosure proposes some simple and effective methods of computing these PC bits.

According to certain embodiments, a method comprises adding an known-bit interleaver in a Polar encoder with distributed CRC (or CRC-interleaved Polar encoder), so as

| Information | Number of bits | Comment |
| --- | --- | --- |
| SFN | 10 | |
| RMSI configuration | [8] | Includes all information needed to receive the PDCCH and PDSCH for RMSI including RMSI presence flag, RMSI/MSG2/4 SCS, possible QCL indication, and indication of initial active bandwidth part(if needed). 8 bits is the target with exact number of bits to be confirmed. |
| SS block time index | 3 | Only present for above 6 GHz |
| Half frame indication | | Inclusion depends on agreement |
| "CellBarred" flag | 1 | |
| 1st PDSCH DMRS position | 1 | Working assumption |
| PRB grid offset | 4 | |
| Reserved bits | [13] (sub 6 GHz) [10] (above 6 GHz) | There will be at least 4 reserved bits. In addition, reserved bits are added to achieve byte alignment. Any additional agreed fields will reduce the number of reserved bits |
| CRC | [19] | Discuss if PBCH CRC should be PBCH-specific or aligned with PDCCH. |
| Total including CRC | 56 | | to compensate for the effect of the CRC interleaver on the known or partially known bits so that the known or partially known bits can be placed judiciously at advantageous positions of the Polar encoder core that can be exploited by the decoder at the receiving end to obtain early termination benefits or to improve error performance.

According to certain embodiments, a method comprises using simple, low complexity method of coupling some data bits with a special set of "artificially" known bits called Parity Check (PC) bits. The value of these PC bits is data dependent. Two simple methods of computing these PC bits are proposed, one summing over all previous data bit values, while the other summing over all previous data bit values and PC bit values.

Certain embodiments of the present disclosure may provide one or more technical advantages. For example, a technical advantage of certain embodiments provides early termination benefits of PBCH decoding. Another advantage is to improve the error performance of the code, e.g. reducing the block error rate.

The latter can be achieved by judiciously placing bits with known values in locations with lower reliability, bits with unknown values are assigned to locations with higher reliability in Polar encoding. Thus, bits with unknown values are more likely to be decoded correctly.

The former can be achieved by comparing the decoded values and the known values of the (partially) known bits to decide if an error has occurred, or alternatively, by examining the decoding path metrics to detect behavior that is typical of an erred block.

Certain embodiments may include all, some, or none of these advantages. Other advantages will be understood by those of ordinary skill in the art.

BRIEF DESCRIPTION OF THE DRAWINGS

FIG. 3 is an examplary table showing an interleaving pattern accord to TS 38.212, Table 5.3.1-1.

DETAILED DESCRIPTION

Known or Partially Known Bit Positioning

Overview of distributed CRC and Interleaver

Figure 1:
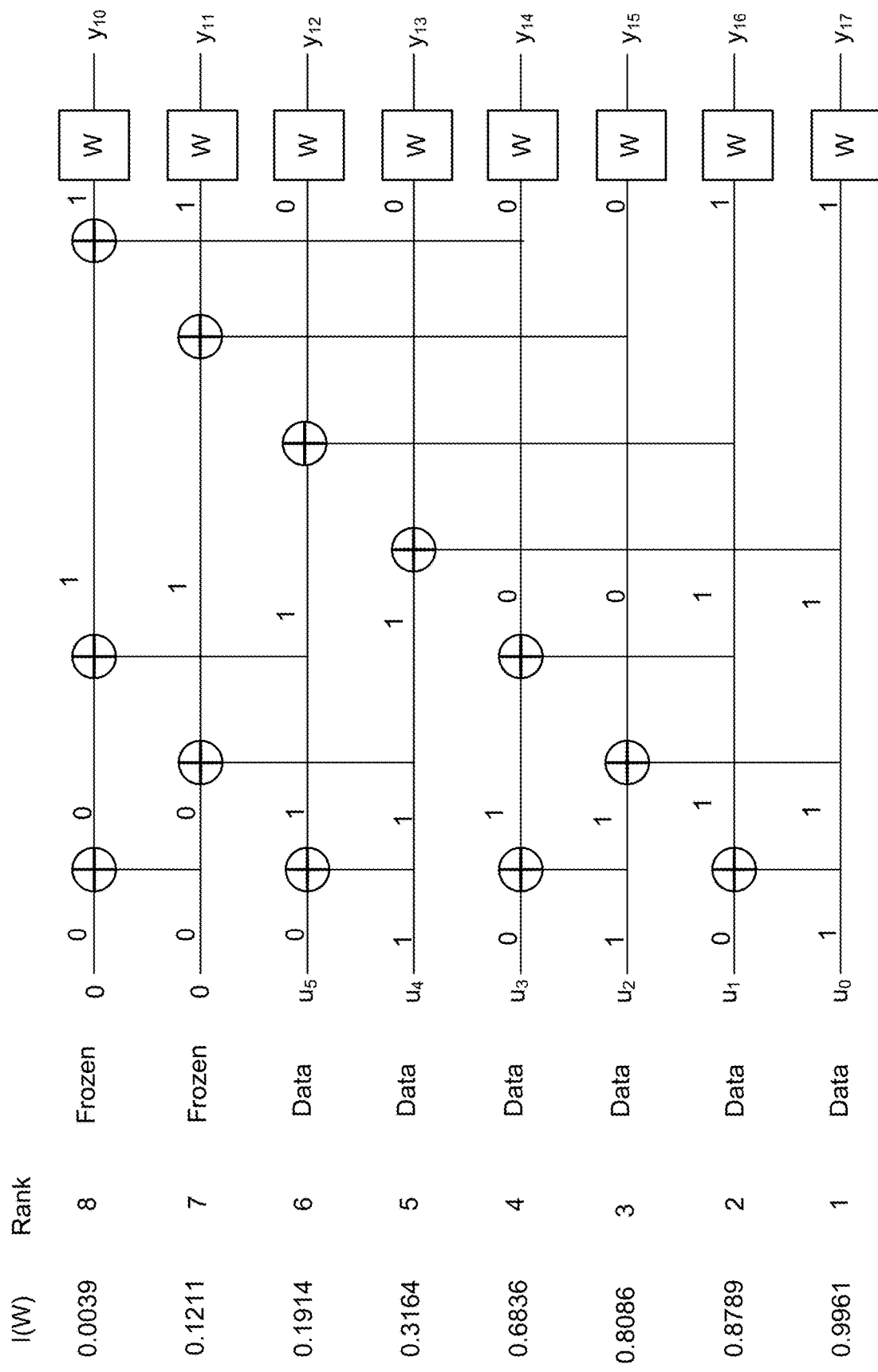
FIG. 1 illustrates a length-8 polar code structure.
Figure 2:
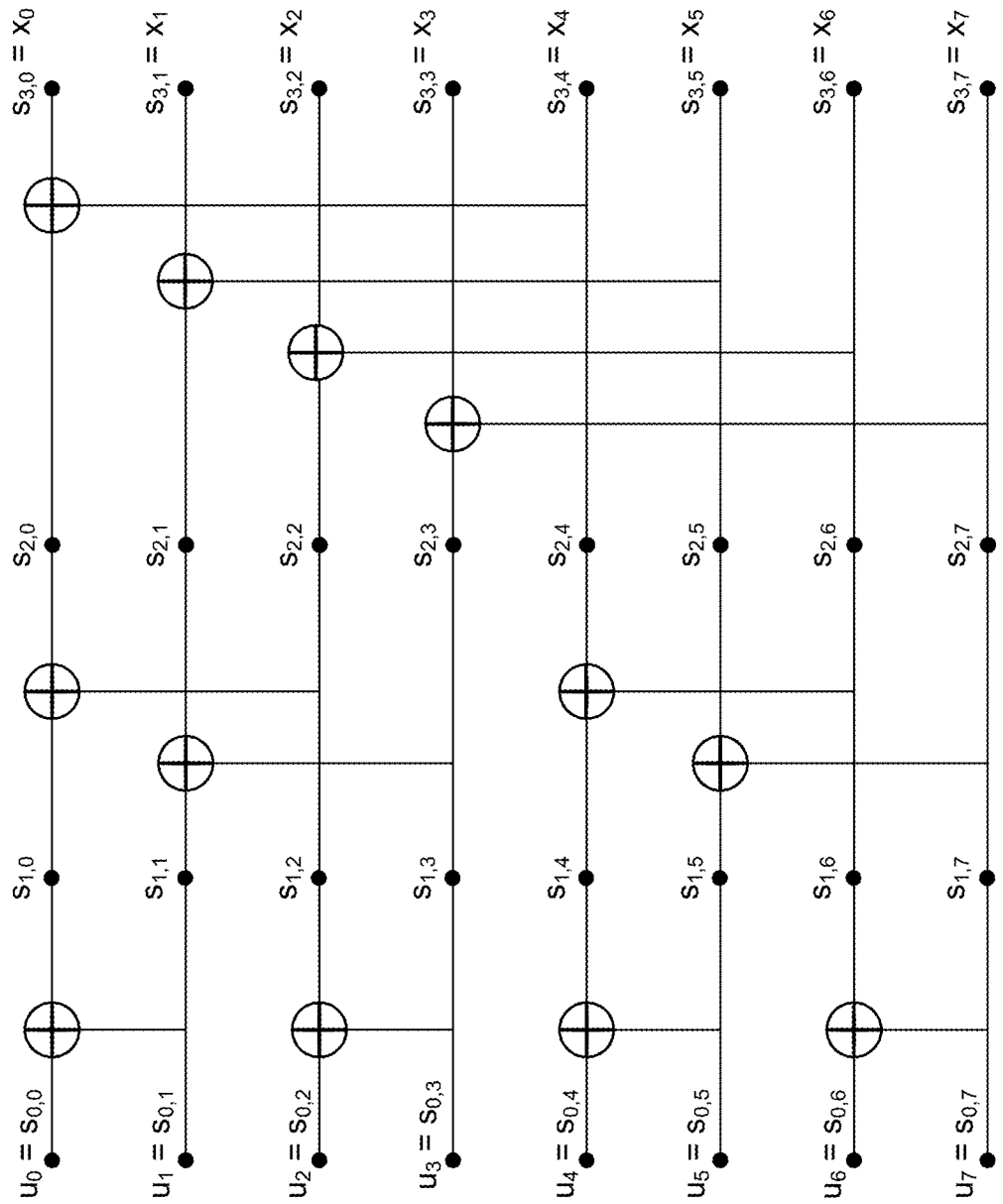
FIG. 2 illustrates another example of polar encoding with N=8.
Figure 4:
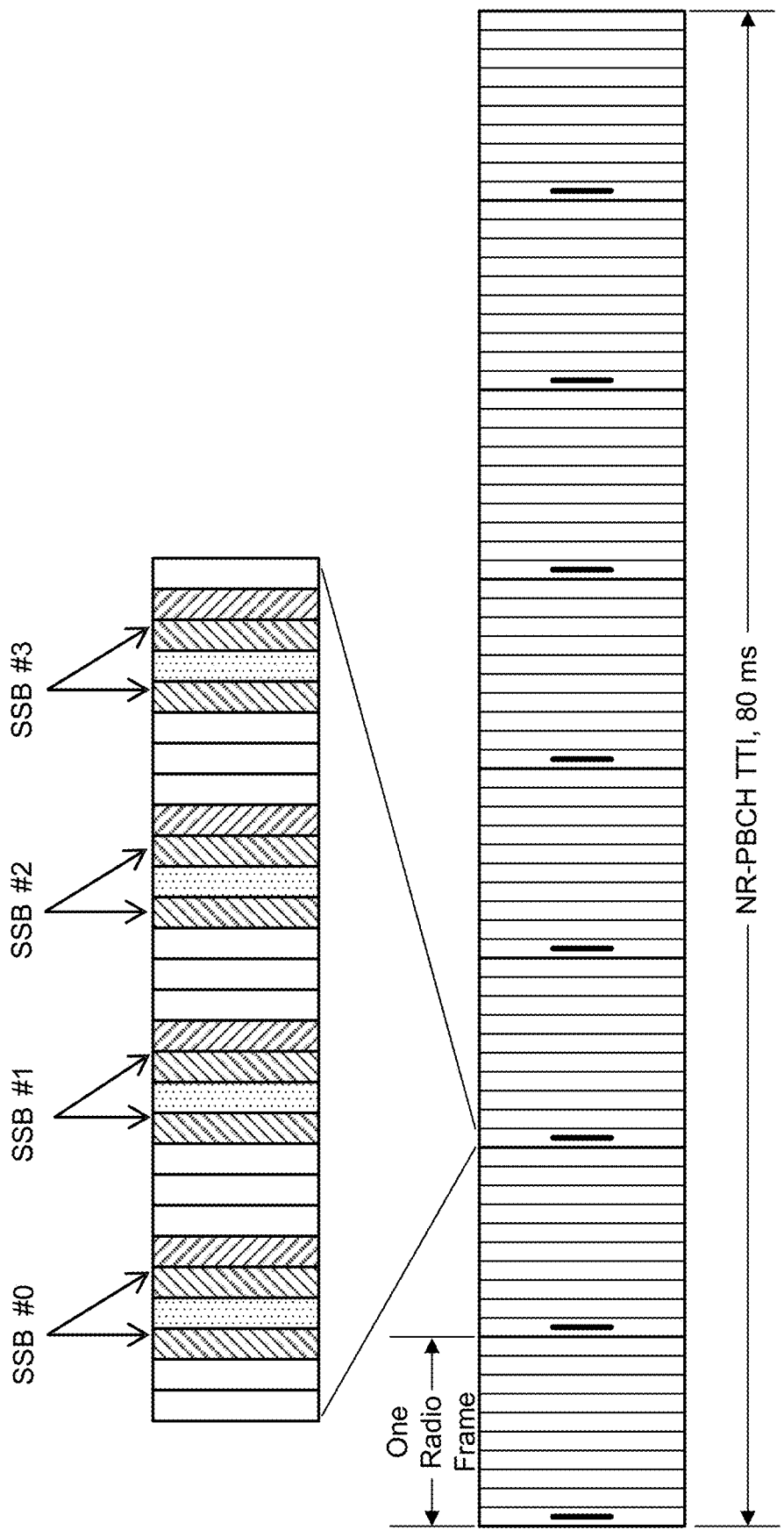
FIG. 4 is a diagram showing system information broadcast together with reference synchronization signal (SS) through beam sweeping.
Figure 5:
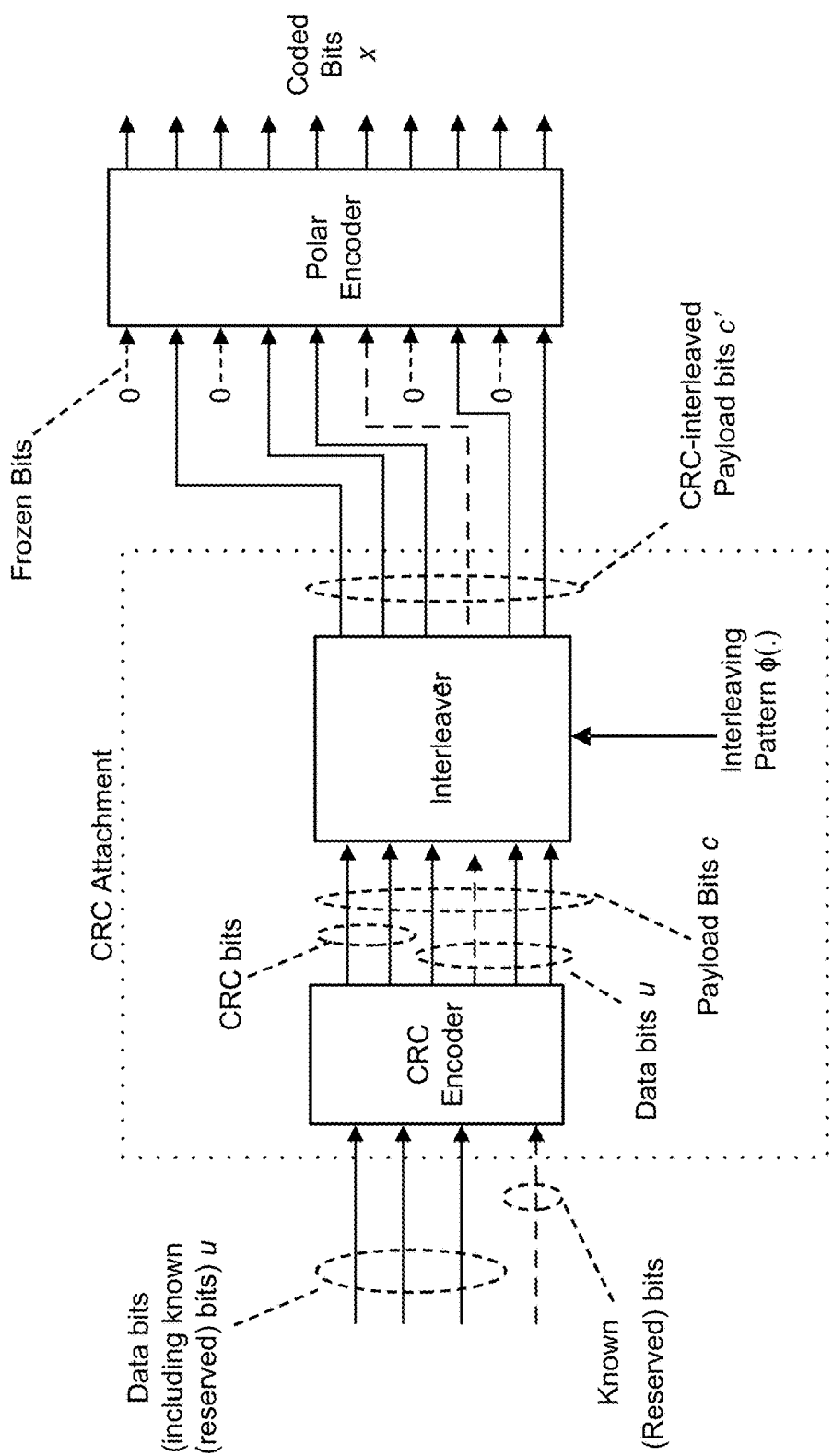
FIG. 5 shows a block diagram describing the operation of CRC-interleaved Polar Encoding system, in accordance with certain embodiments.

FIG. 5 shows a block diagram describing the basic operation in CRC-interleaved Polar Encoding, which is also known as distributed CRC method. Here the data bits are first encoded using a CRC encoder whose output, referred here as payload bits, are interleaved using an CRC interleaver to form the input of the Polar encoder core, which in turns generates the coded bits. Often times, the data bits contain bits with known or partially known values (shown by a dashed line in the figure), such as the reserved bits, which are placed in arbitrary positions that cannot be effectively exploited by Polar decoder.

Known-Bit Interleaver

Figure 6:
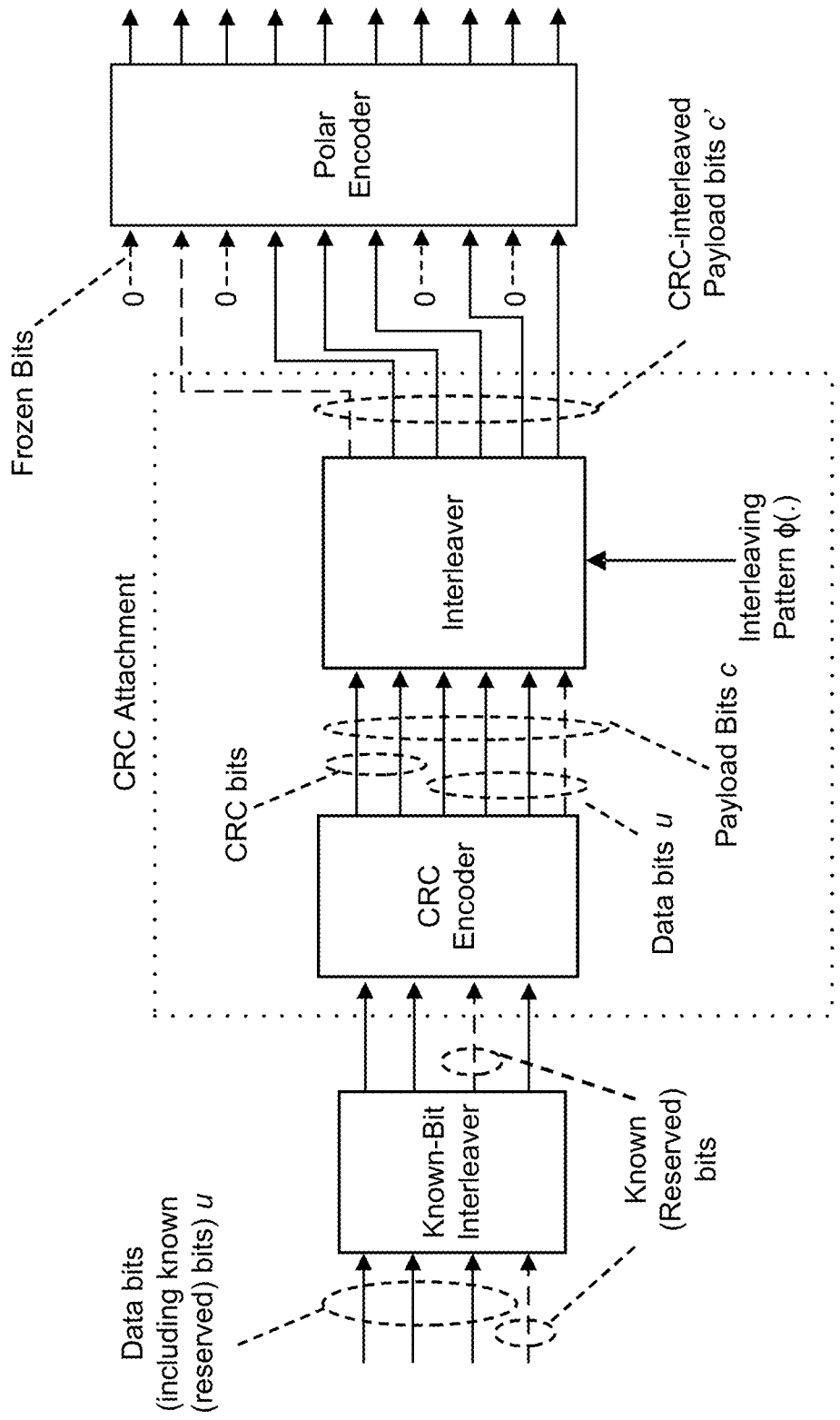
FIG. 6 shows a block diagram of a CRC-interleaved polar encoding system having a known-bit interleaver, in accordance with certain embodiments.

According to certain embodiments, another interleaver is introduced for the known bits in order to compensate for the effect of CRC interleaver so that the known or partially known (reserved) bits can be placed in an advantageous position for the Polar decoder to be exploited to enhance performance, as shown in FIG. 6.

Details in NR-PBCH as Example

Details of Distributed CRC and Interleaver in NR-PBCH

Here we provide more details and specifics in the case of NB-PBCH. The Polar code with distributed CRC is used for NR PBCH as follows.

PBCH payload size including CRC: 56 bits as baseline.
  Option 3 of 64 bits is also included for the purpose of performance comparison.
  Option 1: 56 bits including CRC. CRC19 bits→37 bits information excluding CRC bits.
  Option 2: 56 bits including CRC. CRC24 bits→Reducing number of reserved bits, thus 32 bits information excluding CRC bits. The number of reserved bits is reduced to 8 and 5 for sub 6 GHz and above 6 GHz, respectively.
  Option 3: 64 bits including CRC. CRC24 bits→Increasing number of PBCH bits to 64 bits (8 bit aligned), increasing to 40 bits information excluding CRC bits. The number of reserved bits is increased to 16 and 13 for sub 6 GHz and above 6 GHz, respectively.
Code word size is M=864 bits,
  M=9 (9 usable REs after excluding DMRS)*24 (#PRB) *2 (2 OFDM symbols)*2 (QPSK)=864 bits
Polar code size DL: Mother code $N_{max}$=512 bits.
SCL list size L=8;
Distributed CRC with associated interleaver, same as that of DCI; The decoder can utilize the distributed CRC for early termination of PBCH decoding, if desired;
CRC19:
  Polynomial: 0x97599 [$D^{19}+D^{16}+D^{14}+D^{13}+D^{12}+D^{10}+D^8+D^7+D^4+D^3+1$]
  Length-72 Interleaver for $K_{max}$=53 bits with CRC19 and 3 distributed CRC bits: [1, 4, 5, 8, 10, 11, 14, 15, 16, 20, 24, 26, 28, 30, 31, 35, 44, 45, 46, 48, 51, 52, 58, 12, 19, 21, 22, 25, 32, 33, 37, 38, 39, 47, 68, 7, 9, 17, 18, 27, 41, 50, 61, 0, 2, 3, 6, 13, 23, 29, 34, 36, 40, 42, 43, 49, 53, 54, 55, 56, 57, 59, 60, 62, 63, 64, 65, 66, 67, 69, 70, 71]

CRC24:
Polynomial: 0x1b2b117 $[D^{24}+D^{23}+D^{21}+D^{20}+D^{17}+D^{15}+D^{13}+D^{12}+D^8+D^4+D^2+D+1]$
Length-224 Interleaver for $K_{max}$=200 bits with CRC24, as in TS 38.212 v1.0.0: [0, 2, 3, 5, 6, 8, 11, 12, 13, 16, 19, 20, 22, 24, 28, 32, 33, 35, 37, 38, 39, 40, 41, 42, 44, 46, 47, 49, 50, 54, 55, 57, 59, 60, 62, 64, 67, 69, 74, 79, 80, 84, 85, 86, 88, 91, 94, 102, 105, 109, 110, 111, 113, 114, 116, 118, 119, 121, 122, 125, 126, 127, 129, 130, 131, 132, 136, 137, 141, 142, 143, 147, 148, 149, 151, 153, 155, 158, 161, 164, 166, 168, 170, 171, 173, 175, 178, 179, 180, 182, 183, 186, 187, 189, 192, 194, 198, 199, 200, 1, 4, 7, 9, 14, 17, 21, 23, 25, 29, 34, 36, 43, 45, 48, 51, 56, 58, 61, 63, 65, 68, 70, 75, 81, 87, 89, 92, 95, 103, 106, 112, 115, 117, 120, 123, 128, 133, 138, 144, 150, 152, 154, 156, 159, 162, 165, 167, 169, 172, 174, 176, 181, 184, 188, 190, 193, 195, 201, 10, 15, 18, 26, 30, 52, 66, 71, 76, 82, 90, 93, 96, 104, 107, 124, 134, 139, 145, 157, 160, 163, 177, 185, 191, 196, 202, 27, 31, 53, 72, 77, 83, 97, 108, 135, 140, 146, 197, 203, 73, 78, 98, 204, 99, 205, 100, 206, 101, 207, 208, 209, 210, 211, 212, 213, 214, 215, 216, 217, 218, 219, 220, 221, 222, 223]

3 bits represent the Time index.

The interleaver above is used as an example, mainly because the actual NR-PBCH info block size may vary between implementations. When the final NR-PBCH info block size K is decided, a corresponding interleaver of length (K+$L_{CRC}$) should be defined, where $L_{CRC}$ is the CRC polynomial length for NR-PBCH.

Placement of NR-PBCH Payload Bits

As illustrated by the table of suggested content of PBCH, roughly ⅓ of the PBCH payload bits have known values. This includes:

The "13" and "10" reserved bits for sub 6 GHz and above 6 GHz, respectively.

The 3 bit Time Index for above 6 GHz.
In the hypothesis testing, the time index bits are all zero as used in decoder.

Note that there is no Time Index for sub 6 GHz. Hence all 13 bits are reserved and can be used for early termination.

In summary, for both sub 6 GHz and above 6 GHz, the 13 bits have known values of all-zero.

Although the PBCH payload size and the CRC polynomial/interleaver may vary between implementations, one can already observe that the known bits should be placed as early as possible according to the CRC interleaver pattern, so that the known bits can be leveraged for maximum early termination gain. Placing the bits as early as possible also has the benefit of allowing information-carrying bits to be placed at higher-reliability positions.

In principle, if $K_0$ bits have known values, then the first $K_0$ entries of the CRC interleaver pattern should be used to carry the known values. For examples, Using CRC19 and associated interleaver (given below), and the assumption of $K_0$=13 bits with known values, one should place the 13 known bits at:

Known-bit locations for CRC19: [1, 4, 5, 8, 10, 11, 14, 15, 16, 20, 24, 26, 28].

Using CRC24 and associated interleaver (given below), and the assumption of $K_0$=13 bits with known values, one should place the 13 known bits at:

Known-bit locations for CRC24: [0, 2, 3, 5, 6, 8, 11, 12, 13, 16, 19, 20, 22].

CRC19:
Polynomial: 0x97599 $[D^{19}+D^{16}+D^{14}+D^{13}+D^{12}+D^{10}+D^8+D^7+D^4+D^3+1]$
Length-72 Interleaver for $K_{max}$=53 bits with CRC19 and 3 distributed CRC bits: [1, 4, 5, 8, 10, 11, 14, 15, 16, 20, 24, 26, 28, 30, 31, 35, 44, 45, 46, 48, 51, 52, 58, 12, 19, 21, 22, 25, 32, 33, 37, 38, 39, 47, 68, 7, 9, 17, 18, 27, 41, 50, 61, 0, 2, 3, 6, 13, 23, 29, 34, 36, 40, 42, 43, 49, 53, 54, 55, 56, 57, 59, 60, 62, 63, 64, 65, 66, 67, 69, 70, 71]

CRC24:
Polynomial: 0x1b2b117 $[D^{24}+D^{23}+D^{21}+D^{20}+D^{17}+D^{15}+D^{13}+D^{12}+D^8+D^4+D^2+D+1]$
Length-224 Interleaver for $K_{max}$=200 bits with CRC24, as in TS 38.212 v1.0.0: [0, 2, 3, 5, 6, 8, 11, 12, 13, 16, 19, 20, 22, 24, 28, 32, 33, 35, 37, 38, 39, 40, 41, 42, 44, 46, 47, 49, 50, 54, 55, 57, 59, 60, 62, 64, 67, 69, 74, 79, 80, 84, 85, 86, 88, 91, 94, 102, 105, 109, 110, 111, 113, 114, 116, 118, 119, 121, 122, 125, 126, 127, 129, 130, 131, 132, 136, 137, 141, 142, 143, 147, 148, 149, 151, 153, 155, 158, 161, 164, 166, 168, 170, 171, 173, 175, 178, 179, 180, 182, 183, 186, 187, 189, 192, 194, 198, 199, 200, 1, 4, 7, 9, 14, 17, 21, 23, 25, 29, 34, 36, 43, 45, 48, 51, 56, 58, 61, 63, 65, 68, 70, 75, 81, 87, 89, 92, 95, 103, 106, 112, 115, 117, 120, 123, 128, 133, 138, 144, 150, 152, 154, 156, 159, 162, 165, 167, 169, 172, 174, 176, 181, 184, 188, 190, 193, 195, 201, 10, 15, 18, 26, 30, 52, 66, 71, 76, 82, 90, 93, 96, 104, 107, 124, 134, 139, 145, 157, 160, 163, 177, 185, 191, 196, 202, 27, 31, 53, 72, 77, 83, 97, 108, 135, 140, 146, 197, 203, 73, 78, 98, 204, 99, 205, 100, 206, 101, 207, 208, 209, 210, 211, 212, 213, 214, 215, 216, 217, 218, 219, 220, 221, 222, 223]

After reserving the known-bit locations, the rest of PBCH payload (including CRC bits) should be placed in the remaining (K+$L_{CRC}$−$K_0$) bit locations.

The CRC interleaving is applied as below, $$c'_k = c_{\Pi(k)},$$
$$k = 0, 1, \ldots, K-1$$

The bit ordering of PBCH payload can be described in the following steps. For simplicity, the description focuses on the reserved bits with known values. It should be obvious to those skilled in the art how to apply the same principle for other types of known or partially known bits.

Step 1. PBCH content, MIB, is constructed without consideration of Polar codes. Typically, this puts the reserved bits ('R') towards the end, as illustrated by the first vector in the FIG. 7 (where left is start and right is end). The CRC bits ('C') are placed at the very end, just behind the reserved bits. The rest of the bits in MIB ('b') are placed in front.

Figures 7, 8:
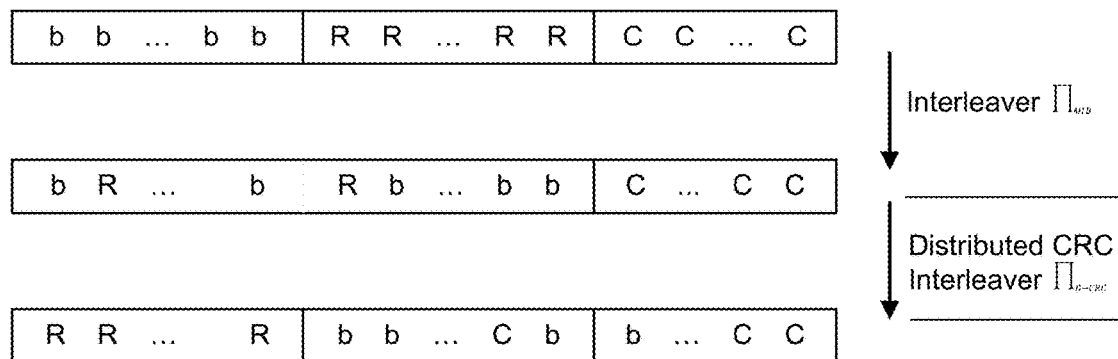
FIG. 7 depicts bit vectos as may be present in the block diagram of FIG. 6, in accordance with certain embodiments.
FIG. 8 is a bit diagram depicting reserved bits 'R' in known bit locations, in accordance with certain embodiments.

Step 2. A MIB content interleaver, $\Pi_{MIB}$, is applied to the MIB content, to obtain the second vector illustrated in FIG. 7. $\Pi_{MIB}$ is constructed so that the reserved bits are interleaved to reverse the effect of the interleaver associated with the distributed CRC bits.

a. For example, if CRC19 and associated interleaver is applied, then the reserved bits 'R' will be in locations as illustrated in FIG. 8.

Step 3. The interleaver associated with the distributed CRC, $\Pi_{D\text{-}DRC}$, is applied. Due to the combined effect of $\Pi_{MIB}$ and $\Pi_{D-DRC}$, the reserved bits 'R' are placed in the beginning of the information vector before entering the Polar encoder core.

PC Bit Generation

According to certain embodiments, some of the bits at the input of the Polar encoder core in FIG. 5 are used as Parity Check (PC) bits, whose values are determined by the values of other data bits (typically those in front of each PC bit). Decoder can then exploit this artificial known relationship between PC bits and other data bits to enhance performance.

In a prior art, three PC bits are used in the PC-CA-Polar construction of UCI, which is based on the shift-register computation of length 5. However, as constructed, the first PC bit does not depend on any info bits and thus reduces to a regular frozen bit in most cases. Even the $2^{nd}$ PC bit is also frozen in a significant number of cases. Only the last PC bit is not frozen in most cases. As a result, the effective number of PC bits is often much less than 3, and as a result, the performance benefit of such a small number of PC bits, if any, is quite limited.

On the other hand, as the last PC bit is often situated far away from the first info bit, the shift register computation is non-trivial and incurs significant additional delay, which is hard to justify when the performance benefit is negligible.

Certain methods can be applied to address the problem.

Method 1: Each PC bits is equal to the sum of all previous bits in a non-recursively manner. That is, simple summation of all the information and frozen bits, excluding any previous PC bits, is used to generate the value of each particular PC bit.

Specifically, let $u=[u_0, u_1, \ldots, u_{N-1}]$ represent the input vector of bits to the Polar encoder core, where N is the size of the Polar code, and let P denote the set of predetermined positions of PC bits. Then for each i E P, the value of the corresponding PC bit can be computed simply by $$u_i = \sum_{j \in \{0,1,\ldots,N-1\} \setminus P : j \leq i} u_j.$$

In other words, the value of each PC bit is the binary sum (i.e. XOR) of all bit values in front of it, except those values of other PC bits.

Method 2. Each PC bits is equal to the sum of all previous bits in a recursively manner. That is, simple summation of all the information and frozen bits, including any previous PC bits, is used to generate the value of each particular PC bit. This can be achieved by shift register with feedback.

Specifically, let $P=\{i_0, i_1, \ldots, i_{|P|}\}$ sorted in such a way that $i_m \leq i_n$ in whenever $m \leq n$. Incrementing m sequentially from 0 to |P| (the number of elements in P), the value of the m-th PC bit can be computed simply by $$u_i = \sum_{j \in \{0,1,\ldots,N-1\} : j \leq i} u_j.$$

In other words, the value of each PC bit is the binary sum (i.e. XOR) of all bit values in front of it, including those values of other previously computed PC bits.

Example Network

According to certain embodiments, the polar encoding techniques disclosed herein may be performed by a wireless transmitter, and the polar decoding techniques disclosed herein may be performed by a wireless receiver. As an example, in certain embodiments, a network node 115 may include a transmitter that uses the polar encoding techniques disclosed herein on a broadcast channel (such as an NR PBCH), and a wireless device 110 may include a receiver that receives the broadcast channel according to decoding techniques disclosed herein. Examples of network node 115 and wireless device 110 are further described below with respect to FIGS. 9-14.

Figure 9:
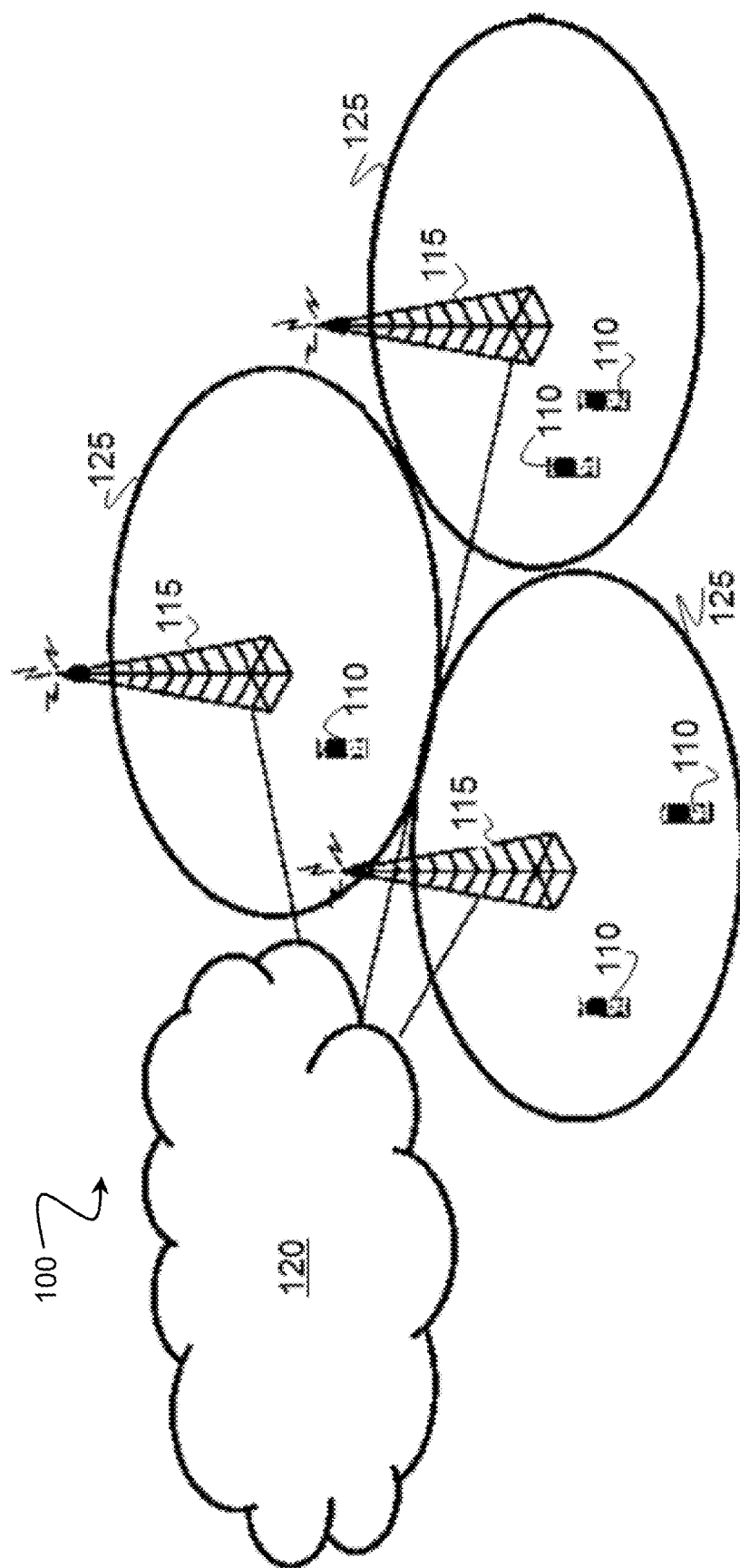
FIG. 9 is a block diagram illustrating an embodiment of a network, in accordance with certain embodiments.

FIG. 9 is a block diagram illustrating an embodiment of a network 100, in accordance with certain embodiments. Network 100 includes one or more UE(s) 110 (which may be interchangeably referred to as wireless devices 110) and one or more network node(s) 115 (which may be interchangeably referred to as gNBs 115). UEs 110 may communicate with network nodes 115 over a wireless interface. For example, a UE 110 may transmit wireless signals to one or more of network nodes 115, and/or receive wireless signals from one or more of network nodes 115. The wireless signals may contain voice traffic, data traffic, control signals, and/or any other suitable information. In some embodiments, an area of wireless signal coverage associated with a network node 115 may be referred to as a cell 125. In some embodiments, UEs 110 may have device-to-device (D2D) capability. Thus, UEs 110 may be able to receive signals from and/or transmit signals directly to another UE.

In certain embodiments, network nodes 115 may interface with a radio network controller. The radio network controller may control network nodes 115 and may provide certain radio resource management functions, mobility management functions, and/or other suitable functions. In certain embodiments, the functions of the radio network controller may be included in network node 115. The radio network controller may interface with a core network node. In certain embodiments, the radio network controller may interface with the core network node via an interconnecting network 120. Interconnecting network 120 may refer to any interconnecting system capable of transmitting audio, video, signals, data, messages, or any combination of the preceding. Interconnecting network 120 may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof.

In some embodiments, the core network node may manage the establishment of communication sessions and various other functionalities for UEs 110. UEs 110 may exchange certain signals with the core network node using the non-access stratum (NAS) layer. In non-access stratum signaling, signals between UEs 110 and the core network node may be transparently passed through the radio access network. In certain embodiments, network nodes 115 may interface with one or more network nodes over an internode interface.

As described above, example embodiments of network 100 may include one or more wireless devices 110, and one or more different types of network nodes capable of communicating (directly or indirectly) with wireless devices 110.

In some embodiments, the non-limiting term UE is used. UEs 110 described herein can be any type of wireless device capable of communicating with network nodes 115 or another UE over radio signals. UE 110 may also be a radio communication device, target device, D2D UE, NB-IoT device, MTC UE or UE capable of machine-to-machine communication (M2M), low-cost and/or low-complexity UE, a sensor equipped with UE, Tablet, mobile terminals, smart phone, laptop embedded equipped (LEE), laptop mounted equipment (LME), USB dongles, Customer Premises Equipment (CPE), etc.

Also, in some embodiments generic terminology, "radio network node" (or simply "network node") is used. It can be any kind of network node, which may comprise a gNB, base station (BS), radio base station, Node B, base station (BS), multi-standard radio (MSR) radio node such as MSR BS, evolved Node B (CNB), network controller, radio network controller (RNC), base station controller (BSC), relay node, relay donor node controlling relay, base transceiver station (BTS), access point (AP), radio access point, transmission points, transmission nodes, Remote Radio Unit (RRU), Remote Radio Head (RRH), nodes in distributed antenna system (DAS), Multi-cell/multicast Coordination Entity (MCE), core network node (e.g., MSC, MME, etc.), O&M, OSS, SON, positioning node (e.g., E-SMLC), MDT, or any other suitable network node.

The terminology such as network node and UE should be considered non-limiting and, in particular, does not imply a certain hierarchical relation between the two; in general, "eNodeB" could be considered as device 1 and "UE" device 2, and these two devices communicate with each other over some radio channel.

Example embodiments of UE 110, network nodes 115, and other network nodes (such as radio network controller or core network node) are described in more detail below with respect to FIGS. 10-14.

Although FIG. 9 illustrates a particular arrangement of network 100, the present disclosure contemplates that the various embodiments described herein may be applied to a variety of networks having any suitable configuration. For example, network 100 may include any suitable number of UEs 110 and network nodes 115, as well as any additional elements suitable to support communication between UEs or between a UE and another communication device (such as a landline telephone). Furthermore, although certain embodiments may be described as implemented in an NR or 5G network, the embodiments may be implemented in any appropriate type of telecommunication system supporting any suitable communication and using any suitable components, and are applicable to any radio access technology (RAT) or multi-RAT systems in which a UE receives and/or transmits signals (e.g., data). For example, the various embodiments described herein may be applicable to IoT, NB-IoT, LTE, LTE-Advanced, UMTS, HSPA, GSM, cdma2000, WCDMA, WiMax, UMB, WiFi, another suitable radio access technology, or any suitable combination of one or more radio access technologies.

Figure 10:
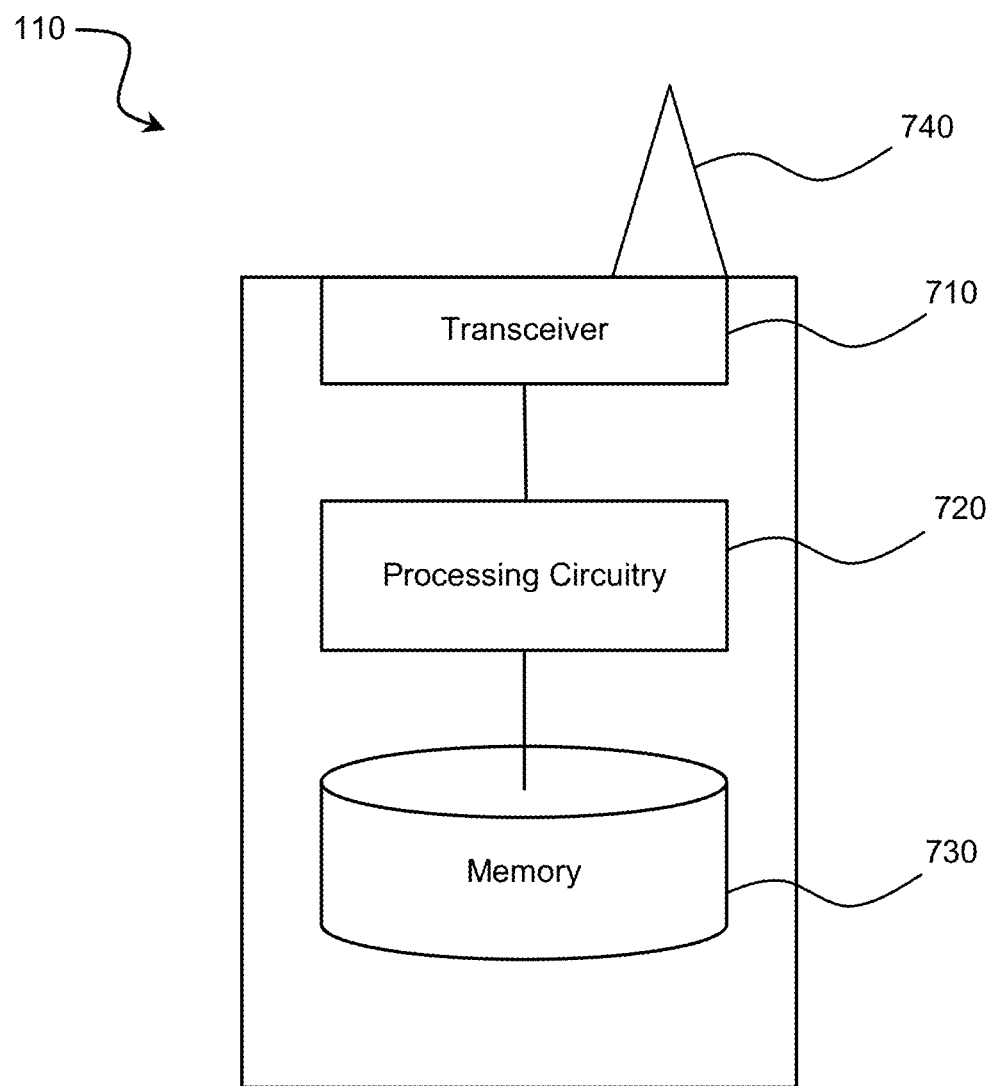
FIG. 10 is a block schematic of an exemplary wireless device, in accordance with certain embodiments.

FIG. 10 is a block schematic of an exemplary wireless device 110, in accordance with certain embodiments. Wireless device 110 may refer to any type of wireless device communicating with a node and/or with another wireless device in a cellular or mobile communication system. Examples of wireless device 110 include a mobile phone, a smart phone, a PDA (Personal Digital Assistant), a portable computer (e.g., laptop, tablet), a sensor, a modem, an MTC device/machine-to-machine (M2M) device, laptop embedded equipment (LEE), laptop mounted equipment (LME), USB dongles, a D2D capable device, or another device that can provide wireless communication. A wireless device 110 may also be referred to as UE, a station (STA), a device, or a terminal in some embodiments. Wireless device 110 includes transceiver 710, processing circuitry 720, and memory 730. In some embodiments, transceiver 710 facilitates transmitting wireless signals to and receiving wireless signals from network node 115 (e.g., via antenna 740), processing circuitry 720 (e.g., which may include one or more processors) executes instructions to provide some or all of the functionality described above as being provided by wireless device 110, and memory 730 stores the instructions executed by processing circuitry 720.

Processing circuitry 720 may include any suitable combination of hardware and software implemented in one or more modules to execute instructions and manipulate data to perform some or all of the described functions of wireless device 110, such as the functions of UE 110 (i.e., wireless device 110) described herein. For example, in general, processing circuitry may decode a broadcast channel, such as an NR PBCH that wireless device 110 receives from network node 115. In some embodiments, processing circuitry 720 may include, for example, one or more computers, one or more central processing units (CPUs), one or more microprocessors, one or more applications, one or more application specific integrated circuits (ASICs), one or more field programmable gate arrays (FPGAs) and/or other logic.

Memory 730 is generally operable to store instructions, such as a computer program, software, an application including one or more of logic, rules, algorithms, code, tables, etc. and/or other instructions capable of being executed by a processor. Examples of memory 730 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information, data, and/or instructions that may be used by processor 1020.

Other embodiments of wireless device 110 may optionally include additional components beyond those shown in FIG. 10 that may be responsible for providing certain aspects of the wireless device's functionality, including any of the functionality described above and/or any additional functionality (including any functionality necessary to support the solution described above). As just one example, wireless device 110 may include input devices and circuits, output devices, and one or more synchronization units or circuits, which may be part of the processing circuitry 720. Input devices include mechanisms for entry of data into wireless device 110. For example, input devices may include input mechanisms, such as a microphone, input elements, a display, etc. Output devices may include mechanisms for outputting data in audio, video, and/or hard copy format. For example, output devices may include a speaker, a display, etc.

Figure 11:
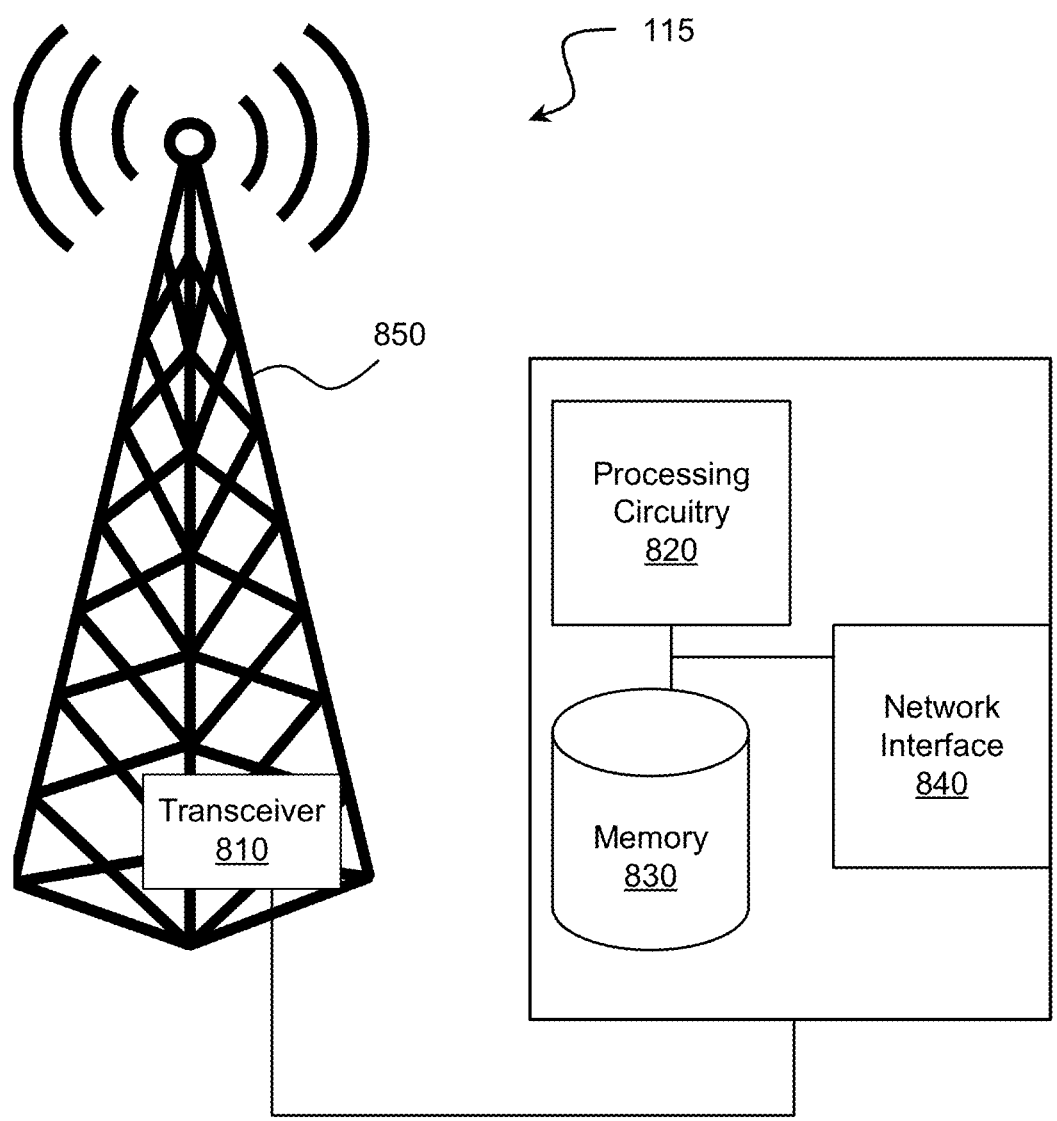
FIG. 11 is a block schematic of an exemplary network node, in accordance with certain embodiments.

FIG. 11 is a block schematic of an exemplary network node 115, in accordance with certain embodiments. Network node 115 may be any type of radio network node or any network node that communicates with a UE and/or with another network node. Examples of network node 115 include an gNB, eNodeB, a node B, a base station, a wireless access point (e.g., a Wi-Fi access point), a low power node, a base transceiver station (BTS), relay, donor node controlling relay, transmission points, transmission nodes, remote RF unit (RRU), remote radio head (RRH), multi-standard radio (MSR) radio node such as MSR BS, nodes in distributed antenna system (DAS), O&M, OSS, SON, positioning node (e.g., E-SMLC), MDT, or any other suitable network node. Network nodes 115 may be deployed throughout network 100 as a homogenous deployment, heterogeneous deployment, or mixed deployment. A homogenous deployment may generally describe a deployment made up of the same (or similar) type of network nodes 115 and/or similar coverage and cell sizes and inter-site distances. A heterogeneous deployment may generally describe deployments using a variety of types of network nodes 115 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 115 may include one or more of transceiver 810, processing circuitry 820 (e.g., which may include one or more processors), memory 830, and network interface 840. In some embodiments, transceiver 810 facilitates transmitting wireless signals to and receiving wireless signals from wireless device 110 (e.g., via antenna 850), processing circuitry 820 executes instructions to provide some or all of the functionality described above as being provided by a network node 115, memory 830 stores the instructions executed by processing circuitry 820, and network interface 840 communicates signals to backend network components, such as a gateway, switch, router, Internet, Public Switched Telephone Network (PSTN), core network nodes or radio network controllers 130, etc.

Processing circuitry 820 may include any suitable combination of hardware and software implemented in one or more modules to execute instructions and manipulate data to perform some or all of the described functions of network node 115 described herein. For example, in general, processing circuitry 820 may perform polar encoding according to the techniques disclosed herein. In some embodiments, processing circuitry 820 may include, for example, one or more computers, one or more central processing units (CPUs), one or more microprocessors, one or more applications, and/or other logic.

Memory 830 is generally operable to store instructions, such as a computer program, software, an application including one or more of logic, rules, algorithms, code, tables, etc. and/or other instructions capable of being executed by a processor. Examples of memory 830 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 840 is communicatively coupled to processing circuitry 820 and may refer to any suitable device operable to receive input for network node 115, send output from network node 115, perform suitable processing of the input or output or both, communicate to other devices, or any combination of the preceding. Network interface 840 may include appropriate hardware (e.g., port, modem, network interface card, etc.) and software, including protocol conversion and data processing capabilities, to communicate through a network.

Other embodiments of network node 115 may include additional components beyond those shown in FIG. 11 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components.

Figure 12:
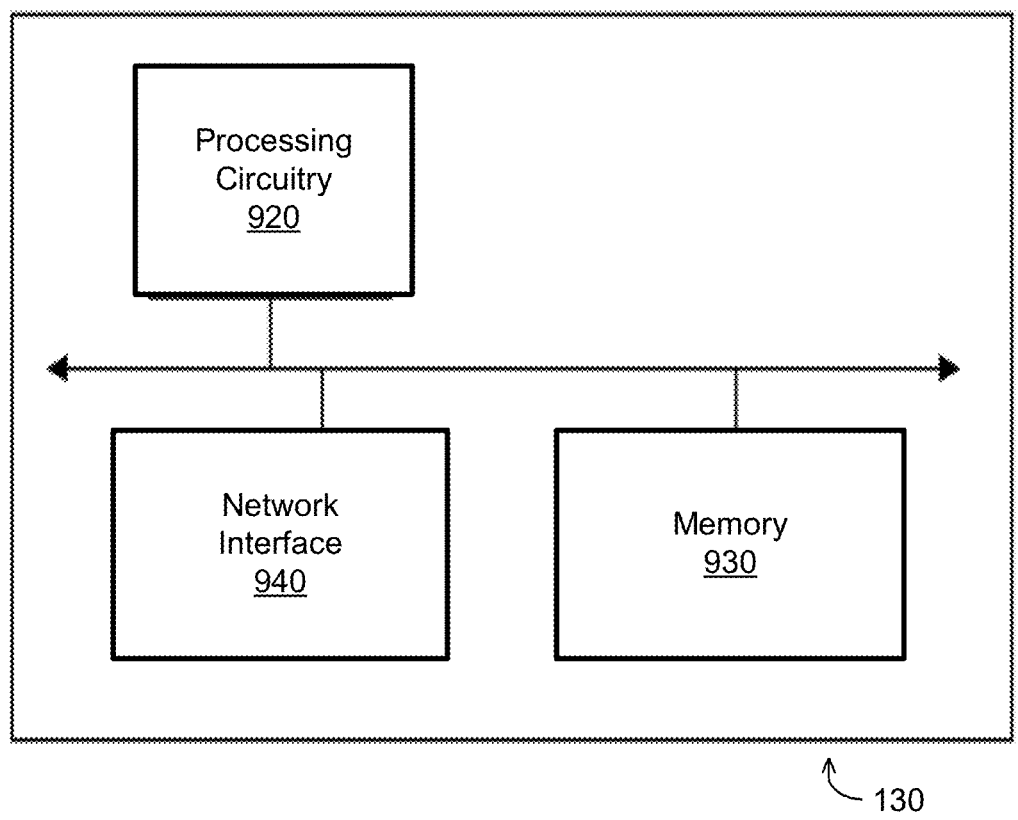
FIG. 12 is a block schematic of an exemplary radio network controller or core network node, in accordance with certian embodiments.

FIG. 12 is a block schematic of an exemplary radio network controller or core network node 130, in accordance with certain embodiments. Examples of network nodes can include a mobile switching center (MSC), a serving GPRS support node (SGSN), a mobility management entity (MME), a radio network controller (RNC), a base station controller (BSC), and so on. The radio network controller or core network node 130 includes processing circuitry 920 (e.g., which may include one or more processors), memory 930, and network interface 940. In some embodiments, processing circuitry 920 executes instructions to provide some or all of the functionality described above as being provided by the network node, memory 930 stores the instructions executed by processing circuitry 920, and network interface 940 communicates signals to any suitable node, such as a gateway, switch, router, Internet, Public Switched Telephone Network (PSTN), network nodes 115, radio network controllers or core network nodes 130, etc.

Processing circuitry 920 may include any suitable combination of hardware and software implemented in one or more modules to execute instructions and manipulate data to perform some or all of the described functions of the radio network controller or core network node 130. In some embodiments, processing circuitry 920 may include, for example, one or more computers, one or more central processing units (CPUs), one or more microprocessors, one or more applications, and/or other logic.

Memory 930 is generally operable to store instructions, such as a computer program, software, an application including one or more of logic, rules, algorithms, code, tables, etc. and/or other instructions capable of being executed by a processor. Examples of memory 930 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 940 is communicatively coupled to processing circuitry 920 and may refer to any suitable device operable to receive input for the network node, send output from the network node, perform suitable processing of the input or output or both, communicate to other devices, or any combination of the preceding. Network interface 940 may include appropriate hardware (e.g., port, modem, network interface card, etc.) and software, including protocol conversion and data processing capabilities, to communicate through a network.

Other embodiments of the network node may include additional components beyond those shown in FIG. 12 that may be responsible for providing certain aspects of the network node's functionality, including any of the functionality described above and/or any additional functionality (including any functionality necessary to support the solution described above).

Figure 13:
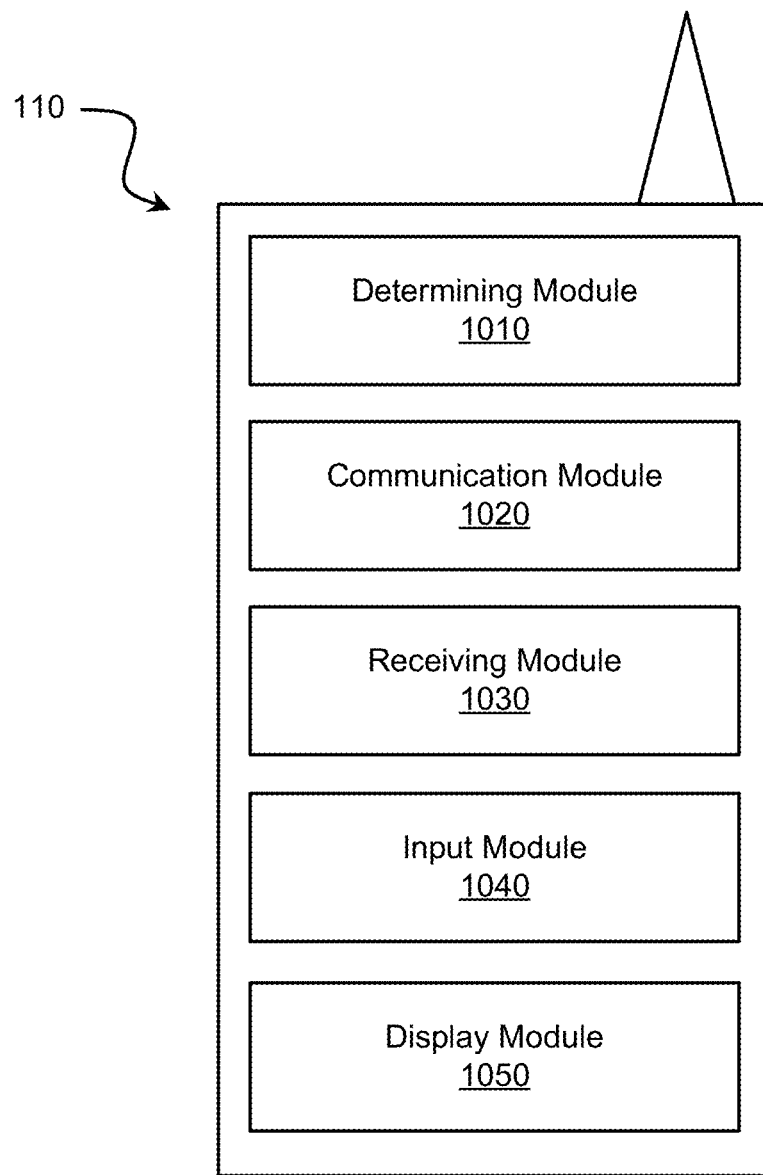
FIG. 13 is a block schematic of an exemplary wireless device, in accordance with certain embodiments.

FIG. 13 is a block schematic of an exemplary wireless device 110, in accordance with certain embodiments. Wireless device 110 may include one or more modules. For example, wireless device 110 may include a determining module 1010, a communication module 1020, a receiving module 1030, an input module 1040, a display module 1050, and/or any other suitable modules. Wireless device 110 may perform the methods related to storing or applying system information described herein.

Determining module 1010 may perform the processing functions of wireless device 110. As one example, determining module 1010 may perform functions related to decoding a channel received from a network node 115. Determining module 1010 may include or be included in one or more processors, such as processing circuitry 720 described above in relation to FIG. 10. Determining module 1010 may include analog and/or digital circuitry configured to perform any of the functions of determining module 1010 and/or processing circuitry 720 described above. The functions of determining module 1010 described above may, in certain embodiments, be performed in one or more distinct modules.

Communication module 1020 may perform the transmission functions of wireless device 110. As one example, communication module 1020 may transmit signals to network node 115. Communication module 1020 may include circuitry configured to wirelessly transmit messages and/or signals. In particular embodiments, communication module 1020 may receive messages and/or signals for transmission from determining module 1010. In certain embodiments, the functions of communication module 1020 described above may be performed in one or more distinct modules.

Receiving module 1030 may perform the receiving functions of wireless device 110. As one example, receiving module 1030 may receive a broadcast channel from network node 115. Receiving module 1030 may include a receiver and/or a transceiver, such as transceiver 710 described above in relation to FIG. 10. Receiving module 1030 may include circuitry configured to wirelessly receive messages and/or signals. In particular embodiments, receiving module 1030 may communicate received messages and/or signals to determining module 1010.

Input module 1040 may receive user input intended for wireless device 110. For example, the input module may receive key presses, button presses, touches, swipes, audio signals, video signals, and/or any other appropriate signals. The input module may include one or more keys, buttons, levers, switches, touchscreens, microphones, and/or cameras. The input module may communicate received signals to determining module 1010. Input module 1040 may be optional in certain embodiments.

Display module 1050 may present signals on a display of wireless device 110. Display module 1050 may include the display and/or any appropriate circuitry and hardware configured to present signals on the display. Display module 1050 may receive signals to present on the display from determining module 1010. Display module 1050 may be optional in certain embodiments.

Determining module 1010, communication module 1020, receiving module 1030, input module 1040, and display module 1050 may include any suitable configuration of hardware and/or software. Wireless device 110 may include additional modules beyond those shown in FIG. 13 that may be responsible for providing any suitable functionality, including any of the functionality described above and/or any additional functionality (including any functionality necessary to support the various solutions described herein).

Figure 14:
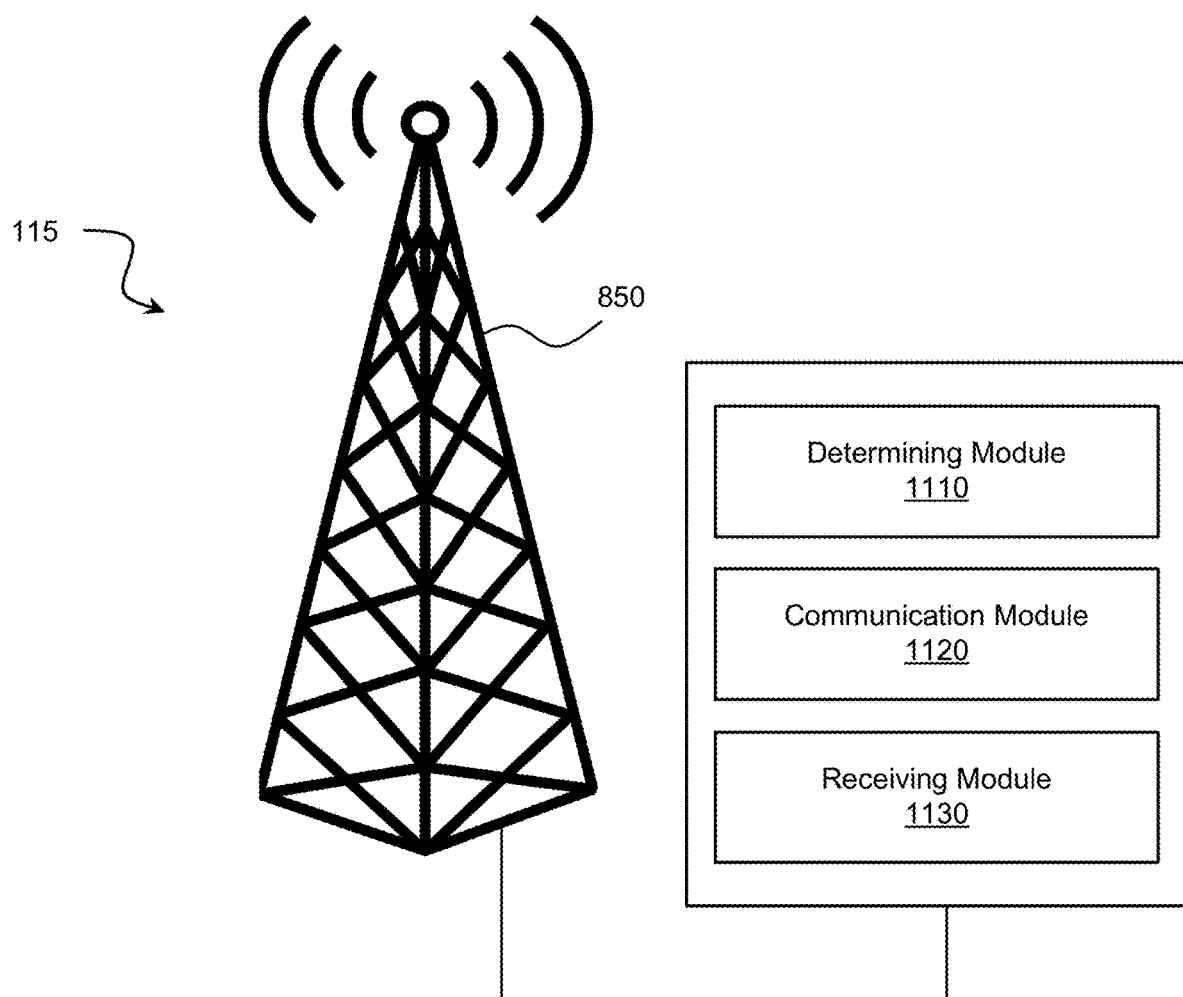
FIG. 14 is a block schematic of an exemplary network node, in accordance with certain embodiments These figures will be better understood by reference to the following detailed description.

FIG. 14 is a block schematic of an exemplary network node 115, in accordance with certain embodiments. Network node 115 may include one or more modules. For example, network node 115 may include determining module 1110, communication module 1120, receiving module 1130, and/or any other suitable modules. In some embodiments, one or more of determining module 1110, communication module 1120, receiving module 1130, or any other suitable module may be implemented using one or more processors, such as processing circuitry 820 described above in relation to FIG. 11. In certain embodiments, the functions of two or more of the various modules may be combined into a single module. Network node 115 may perform the methods described as being performed by a network node (such as a gNB).

Determining module 1110 may perform the processing functions of network node 115. As one example, determining module 1110 may perform polar encoding (e.g., polar encoding for a broadcast channel, such as NR PBCH) according to the techniques disclosed herein. Determining module 1110 may include or be included in one or more processors, such as processing circuitry 820 described above in relation to FIG. 11. Determining module 1110 may include analog and/or digital circuitry configured to perform any of the functions of determining module 1110 and/or processing circuitry 820 described above. The functions of determining module 1110 may, in certain embodiments, be performed in one or more distinct modules. For example, in certain embodiments some of the functionality of determining module 1110 may be performed by an allocation module.

Communication module 1120 may perform the transmission functions of network node 115. As examples, communication module 1120 may transmit a broadcast channel that has been encoded using polar encoding. Communication module 1120 may transmit messages to one or more of wireless devices 110. Communication module 1120 may include a transmitter and/or a transceiver, such as transceiver 810 described above in relation to FIG. 11. Communication module 1120 may include circuitry configured to wirelessly transmit messages and/or signals. In particular embodiments, communication module 1120 may receive messages and/or signals for transmission from determining module 1110 or any other module.

Receiving module 1130 may perform the receiving functions of network node 115. Receiving module 1130 may receive any suitable information from a wireless device. Receiving module 1130 may include a receiver and/or a transceiver, such as transceiver 810 described above in relation to FIG. 11. Receiving module 1130 may include circuitry configured to wirelessly receive messages and/or signals. In particular embodiments, receiving module 1130 may communicate received messages and/or signals to determining module 1110 or any other suitable module.

Determining module 1110, communication module 1120, and receiving module 1130 may include any suitable configuration of hardware and/or software. Network node 115 may include additional modules beyond those shown in FIG. 14 that may be responsible for providing any suitable functionality, including any of the functionality described above and/or any additional functionality (including any functionality necessary to support the various solutions described herein).

Additional Exemplary Embodiments

1. A method, comprising:
   identifying payload bits of a broadcast channel having known values;
   determining where to place the payload bits having known values when performing polar coding of the broadcast channel.

2. The method of example embodiment 1, further comprising placing a Parity Check (PC) bit at a pre-determined location.

3. The method of example embodiment 2, further comprising coupling a data bit with the PC bit.

4. A method, comprising: adding a known-bit interleaver in a Polar encoder with distributed CRC so as to compensate for the effect of the CRC interleaver on the known or partially known bits.

5. A network node comprising memory operable to store instructions and processing circuitry operable to execute the instructions, whereby the network node is operable to perform any of the methods of example embodiments 1-4.

6. A computer program product comprising a non-transitory computer readable medium storing computer readable program code, the computer readable program code comprises program code for performing any of the methods of example embodiments 1-4.

7. A method, comprising:
  decoding a broadcast channel received from a network node, wherein the broadcast channel is encoded according to polar encoding that places payload bits having known values in pre-determined locations.

8. The method of example embodiment 7, wherein the polar encoding places a Parity Check (PC) bit at a respective pre-determined location.

9. The method of example embodiment 8, wherein the polar encoding couples a data bit with the PC bit.

10. A wireless device comprising memory operable to store instructions and processing circuitry operable to execute the instructions, whereby the wireless device is operable to perform any of the methods of example embodiments 7-9.

11. A computer program product comprising a non-transitory computer readable medium storing computer readable program code, the computer readable program code comprises program code for performing any of the methods of example embodiments 7-9.

Abbreviations

| Abbreviation | Explanation |
| --- | --- |
| SC | Successive Cancellation |
| SCL | Successive Cancellation List |
| QAM | Quadrature Amplitude Modulation |
| LLR | Log Likelihood Ratio |
| OFDM | Orthogonal Frequency Division Multiplex |
| DFTS OFDM | Discrete Fourier Transform Spread OFDM |
| NR | New Radio |
| PBCH | Physical Broadcast Channel |
| SSB | Synchronization Signal Block |
| PDSCH | Physical Downlink Shared Channel |
| PUSCH | Physical Uplink Shared Channel |
| MIB | Master Information Block |
| SIB | System Information Block |
| UCI | Uplink Control Information |
| DCI | Downlink Control Information |
| HARQ | Hybrid Automatic Repeat Request |
| IR-HARQ | Incremental Redundancy HARQ |

What is claimed is:

1. A method for preparing a transport block for transmission by a network node, the method comprising:
  generating a first set of payload bits to be encoded for transmission to a wireless device;
  interleaving the first set of payload bits to generate a second set of payload bits;
  generating a set of one or more parity check bits based on the first set of payload bits or the second set of payload bits, wherein at least one of the one or more parity check bits has a value known to the wireless device;
  providing the second set of payload bits and the set of parity check bits to a cyclic redundancy check (CRC) encoder to generate a third set of payload bits, wherein the third set includes at least some of the parity check bits in a predetermined position within the third set;
  encoding the third set with polar encoding for transmission to the wireless device; and
  transmitting the polar-encoded third set to the wireless device.

2. The method of claim 1, wherein the value known to the wireless device is known or partially known.

3. The method of claim 1, wherein parity check bits are interleaved such that one or more parity check bits are positioned in a high reliability position for transmission.

4. The method of claim 1, wherein the set of payload bits comprises at least 13 known bits and wherein the known bits are placed at the following positions in the interleaved set of payload bits: [1, 4, 5, 8, 10, 11, 14, 15, 16, 20, 24, 26, 28].

5. The method of claim 1, wherein the one or more parity bits comprise values that are determined by the values of other bits in the CRC-interleaved set.

6. A network node for communication in a cellular communications network, the network node comprising:
  a network interface in communication with a radio transceiver for communication with a wireless device via the cellular communications network;
  a memory having executable instructions stored thereon;
  processing circuitry in communication with the memory such that, when the processing circuitry executes the instructions, the processing performs operations comprising:
    generating a first set of payload bits to be encoded for transmission to a wireless device;
    interleaving the first set of payload bits to generate a second set of payload bits, wherein the second set includes the at least one known bit in a predetermined position in the second set;
    generating a set of one or more parity check bits based on the first set of payload bits or the second set of payload bits, wherein at least some of the parity check bits have values known to the wireless device;
    providing the second set of payload bits and the set of parity check bits to a cyclic redundancy check (CRC) encoder to generate a third set of payload bits, wherein the third set includes at least some of the parity check bits in a predetermined position within the third set;
    encoding the third set with polar encoding for transmission to the wireless device; and
    transmitting the polar-encoded third set to the wireless device.

7. The network node of claim 6, wherein the known values are known or partially known.

8. The network node of claim 6, wherein encoding the third set for transmission comprises using a polar encoder to encode the third set for transmission.

9. The network node of claim 6, wherein the second set is interleaved such that the at least one known bit is located in a high reliability position for transmission.

10. The network node of claim 9, wherein the one or more parity check bits comprise values that are determined by the values of other bits in the CRC-interleaved set.

11. The network node of claim 6, wherein the set of payload bits comprises at least 13 known bits and wherein the known bits are placed at the following positions in the interleaved set of payload bits: [1, 4, 5, 8, 10, 11, 14, 15, 16, 20, 24, 26, 28].

12. The network node of claim 6, wherein the processing circuitry comprises:
- a first interleaver, wherein the first interleaver is a known-bit interleaver;
- a cyclic redundancy check (CRC) encoder coupled to the first interleaver and to a second interleaver; and
- a polar encoder coupled to the second interleaver.

13. A method, comprising:
- receiving a physical broadcast channel (PBCH) transmission from a network node, the PBCH transmission being encoded according to a polar encoding that places at least one known bit in a known location in the PBCH transmission, the at least one known bit having a known value; and
- decoding the PBCH transmission received from the network node, wherein the decoding is based on the known value.

14. The method of claim 13, wherein the polar encoding places a parity check (PC) bit at the known location.

15. The method of claim 14, wherein the polar encoding couples a data bit with the PC bit and wherein a value of the PC bit is determined based on the data bit.

* * * * *